United States Patent
Bennett

(10) Patent No.: US 10,649,925 B2
(45) Date of Patent: May 12, 2020

(54) INDIRECT DATA RETURN FROM MEMORY CONTROLLER LOGIC

(71) Applicant: Microsoft Technology Licensing, LLC, Redmond, WA (US)

(72) Inventor: John Grant Bennett, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 55 days.

(21) Appl. No.: 15/981,861

(22) Filed: May 16, 2018

(65) Prior Publication Data

US 2019/0354492 A1    Nov. 21, 2019

(51) Int. Cl.
     *G06F 13/16*      (2006.01)
     *G06F 3/06*      (2006.01)
     *G06F 12/02*      (2006.01)

(52) U.S. Cl.
     CPC ........ *G06F 13/1668* (2013.01); *G06F 3/0659* (2013.01); *G06F 12/023* (2013.01)

(58) Field of Classification Search
     CPC ... G06F 9/34–3557; G06F 12/14–1491; G06F 13/1668–1694
     See application file for complete search history.

(56) References Cited

U.S. PATENT DOCUMENTS

| | | | |
|---|---|---|---|
| 6,173,388 B1 * | 1/2001 | Abercrombie | G06F 9/30145 345/563 |
| 9,892,033 B1 * | 2/2018 | Sabbag | G06F 12/0246 |
| 2003/0182564 A1 * | 9/2003 | Lai | G06F 12/1408 713/193 |
| 2006/0181957 A1 | 8/2006 | Walker | |
| 2006/0259431 A1 * | 11/2006 | Poisner | G06F 21/126 705/51 |
| 2006/0288194 A1 * | 12/2006 | Lewis | G06F 9/30076 712/220 |
| 2008/0010420 A1 | 1/2008 | Kao | |
| 2016/0314822 A1 * | 10/2016 | Yeung | G06F 13/16 |
| 2017/0017399 A1 * | 1/2017 | Zheng | G06F 3/0604 |

OTHER PUBLICATIONS

"International Search Report and Written Opinion Issued in PCT Application No. PCT/US19/029562", dated Jul. 24, 2019, 12 Pages.

* cited by examiner

*Primary Examiner* — Nicholas J Simonetti
(74) *Attorney, Agent, or Firm* — Watson Patents, PLC; Vladan M. Vasiljevic

(57) ABSTRACT

A portion of the memory space, supported by memory chips that are being controlled by a memory controller logic, can be set aside and read requests directed to memory addresses within that portion can be redirected, by the memory controller logic, to other memory addresses at which is stored the data equivalent to the internal data of the memory controller logic that the memory controller logic seeks to return, thereby enabling the memory controller logic to indirectly return data to processes executing on the host computing device. Additionally, requests to write data to specific memory addresses, including memory addresses that can be within the set aside portion, can be interpreted, by the memory controller logic, as commands that the memory controller logic is to perform, and which impact its own internal data including commands to reset values, or start or end data collection, or other like commands.

20 Claims, 6 Drawing Sheets

INDIRECT DATA RETURN FROM MEMORY CONTROLLER LOGIC

BACKGROUND

Modern computer hardware includes memory devices that can comprise multiple memory integrated circuits, such as chips, in combination with memory controller logic hardware integrated circuits, which can also be in a chip form. Typically, such memory devices provide Random Access Memory (RAM) for the computing device and are constructed in standardized forms, such as having a standardized sizing, standardized physical connections, and other like physical construction parameters, thereby enabling such memory devices manufactured by different entities to be interchangeable, replaceable and upgradable. Because the physical connections of, for example, a traditional Dynamic RAM (DRAM) memory module are standardized, they cannot be deviated from without negatively impacting the physical connectivity of such a DRAM memory module. Unfortunately, however, the standardized physical connections of memory modules do not provide for electrical pathways by which data can be obtained from the memory controller logic. Instead, the standardized physical connections of a DRAM memory module only provide for the reading of data from (and the writing of data to) the memory chips themselves. Thus, memory controller logic circuitry does not have a mechanism by which it can return its own internal data to processes executing on the host computing device.

SUMMARY

To enable memory controller logic to return its own internal data to processes executing on the host computing device, a portion of the memory space supported by the memory integrated circuits that are being controlled by the memory controller logic can be set aside and read requests directed to memory addresses within that portion can be redirected, by the memory controller logic, to other memory addresses at which is stored the data equivalent to the internal data of the memory controller logic that the memory controller logic seeks to return, thereby enabling the memory controller logic to indirectly return data to processes executing on the host computing device. The portion of the memory space that is set aside can comprise memory addresses at which are stored different kinds or values of data, thereby enabling the memory controller logic to select, from among them, the data that the memory controller logic wishes to indirectly return. Upon identifying the memory address at which such data is stored, the memory controller logic can open a communicational path between processes executing on the host computing device and that memory location as if that memory location was the location originally requested by the processes executing on the host computing device. Sequential requests to read data from memory addresses within a set-aside portion can be interpreted, by the memory controller logic, as requests for different, subsequent sets of internal data, and the memory controller logic can sequentially return such different internal sets of data utilizing the indirect data return procedure referenced above. Additionally, requests to write data to specific memory addresses, including memory addresses that can be within the set aside portion, can be interpreted, by the memory controller logic, as commands that the memory controller logic is to perform, and which impact its own internal data including commands to reset values, or start or end data collection, or other like commands directed to the data that is internal to the memory controller logic. By enabling a data return from memory controller logic, such logic can be then utilized to collect, at a hardware level, data regarding memory usage including, for example, data enumerating reads, writes, or combinations thereof directed to specific memory addresses, or groups thereof.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

Figure 1:
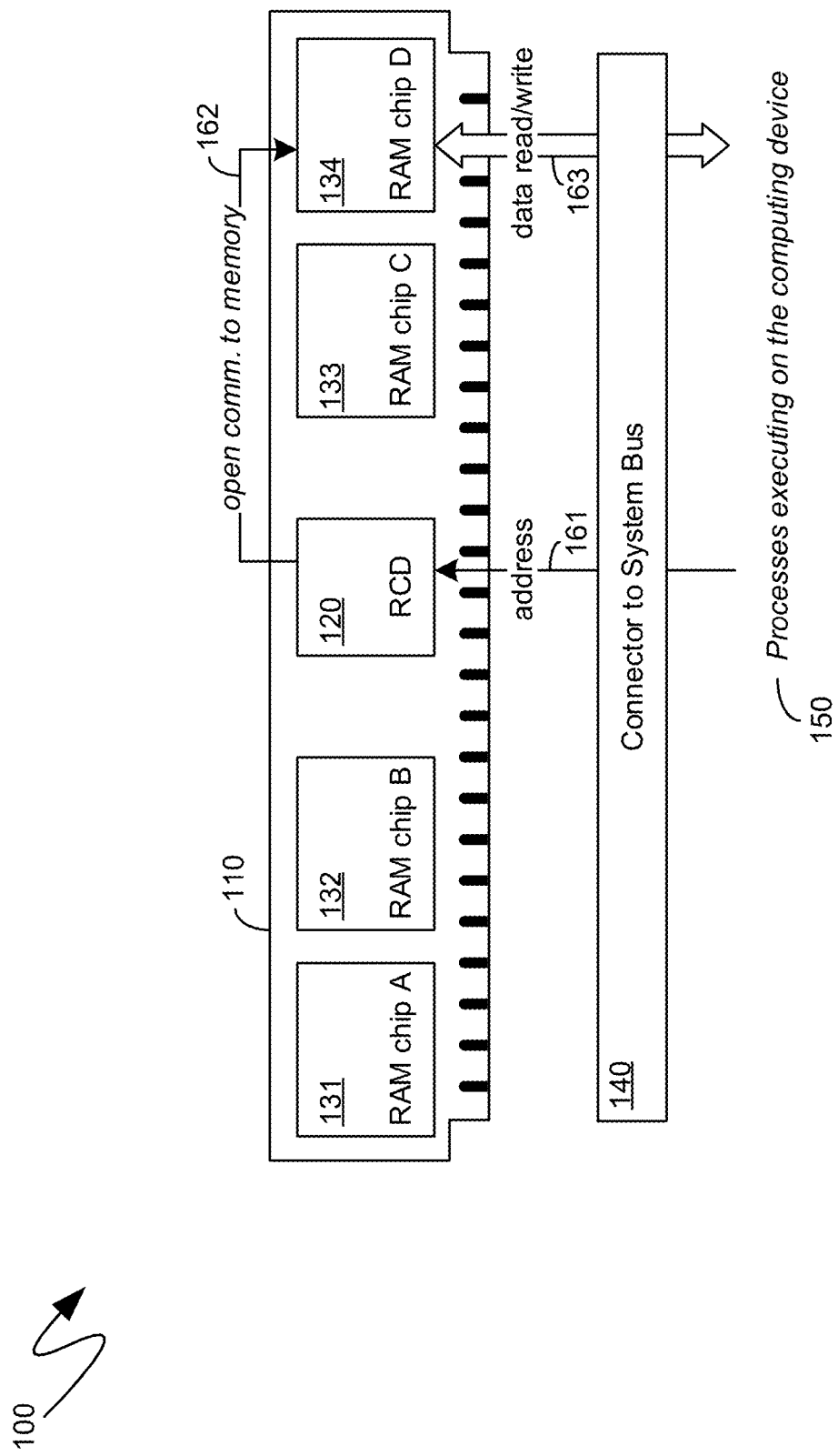
FIG. 1 is a system diagram of an exemplary physical memory device structure and connection.

The following description relates to enabling memory controller logic to return its own internal data to processes executing on the host computing device, when standardized connectivity hardware does not provide for any direct data return mechanism from such memory controller logic. A portion of the memory space supported by the memory integrated circuits that are being controlled by the memory controller logic can be set aside and pre-populated with data from which the memory controller logic can choose. Subsequently, read requests directed to memory addresses within that portion can be redirected, by the memory controller logic, to other memory addresses at which is stored the data equivalent to the internal data of the memory controller logic that the memory controller logic seeks to return, thereby enabling the memory controller logic to indirectly return data to processes executing on the host computing device. The portion of the memory space that is set aside can comprise memory addresses at which are stored different kinds or values of data, thereby enabling the memory controller logic to select, from among them, the data that the memory controller logic wishes to indirectly return. Upon identifying the memory address at which such data is stored, the memory controller logic can open a communicational path between processes executing on the host computing device and that memory location as if that memory location was the location originally requested by the processes executing on the host computing device. Sequential requests to read data from memory addresses within a set-aside portion can be interpreted, by the memory controller logic, as requests for different, subsequent sets of internal data, and the memory controller logic can sequentially return such different internal sets of data utilizing the indirect data return procedure referenced above. Additionally, requests to write data to specific memory addresses, including memory addresses that can be within the set aside portion, can be interpreted, by the memory controller logic, as commands that the memory controller logic is to perform, and which impact its own internal data including commands to reset values, or start or end data collection, or other like commands directed to the data that is internal to the memory controller logic. By enabling a data return from memory controller logic, such logic can be then utilized to collect, at a hardware level, data regarding memory usage including, for example, data enumerating reads, writes, or combinations thereof directed to specific memory addresses, or groups thereof.

Although not required, the description below will be in the general context of computer-executable instructions, such as program modules, being executed by a computing device. More specifically, the description will reference acts and symbolic representations of operations that are performed by one or more computing devices or peripherals, unless indicated otherwise. As such, it will be understood that such acts and operations, which are at times referred to as being computer-executed, include the manipulation by a processing unit of electrical signals representing data in a structured form. This manipulation transforms the data or maintains it at locations in memory, which reconfigures or otherwise alters the operation of the computing device or peripherals in a manner well understood by those skilled in the art. The data structures where data is maintained are physical locations that have particular properties defined by the format of the data.

Generally, program modules include routines, programs, objects, components, data structures, and the like that perform particular tasks or implement particular abstract data types. Moreover, those skilled in the art will appreciate that the computing devices need not be limited to conventional personal computers, and include other computing configurations, including servers, hand-held devices, multi-processor systems, microprocessor based or programmable consumer electronics, network PCs, minicomputers, mainframe computers, and the like. Similarly, the computing devices need not be limited to stand-alone computing devices, as the mechanisms may also be practiced in distributed computing environments where tasks are performed by remote processing devices that are linked through a communications network. In a distributed computing environment, program modules may be located in both local and remote memory storage devices.

With reference to FIG. 1, an exemplary system 100 is illustrated, providing context for the descriptions below. The exemplary system 100 of FIG. 1 illustrates a memory module 110 comprising multiple computer-readable memory integrated circuit devices, in the form of Random Access Memory (RAM) chips 131, 132, 133 and 134 as well as memory controller logic integrated circuitry in the form of a Register Control Driver (RCD) chip 120. The physical structure of the exemplary memory module 110 can be dictated by various standards in order to facilitate the interchangeability and interoperability of all such memory modules that conform to those standards. For example, Dual In-line Memory Modules (DIMMs) can be provided in accordance with one of several common form factors, which can specify the height of such DIMMs, the width of such DIMMs, and the quantity of "pins" or independent electrical and/or communicational connections between the DIMM and the motherboard of the host computing device.

An RCD chip, such as the exemplary RCD chip 120 can receive commands from one or more of the processing units of the computing device, such as the ubiquitous Central Processing Unit (CPU) and can then process such commands to facilitate the CPU's access to the data stored on the RAM chips of the memory module 110. More specifically, the RCD chip 120 can monitor the communicational signals being exchanged via the system bus to which the memory module 110 is communicationally coupled and can monitor for signals directed to the memory chips of the memory module 110 being controlled by the RCD chip 120. Upon detecting such communications, the RCD can buffer them, and then amplify such signals, as well as re-synchronizing the timing of such signals to be more stable. The signals can then be distributed by the RCD chip 120 to the appropriate memory chip. For example, as illustrated in the exemplary system 100 of FIG. 1, a communication 161 can be detected by the RCD 120 as the communication is passed along the system bus from processes 150 executing on the computing device, more specifically on one or more of the processing units of the computing device. The communication 161 can include an address of a memory location from which data is to be read or to which data is to be written. The RCD 120 can identify which specific integrated circuit, such as the exemplary RAM chip 134, comprises the individual computer-readable memory circuitry whose electrical charge represents the digital data that is to be read, or whose electrical charge will represent the digital data once it is written, based on the address specified by the communication 161. As illustrated by the action 162, the RCD 120 can buffer the communication 161, amplify it and/or resynchronize it for more stable timing, and can then pass the communication along to the identified chip, such as the exemplary RAM chip 134, which can result in the opening of an electrical communicational connection between the relevant individual computer-readable memory circuitry of the RAM chip 134 and the processes 150 executing on the computing device, as illustrated by the communicational connection 163. Through such a communicational connection 163, the processes 150 executing on the computing device can read data from the relevant individual computer-readable memory circuitry of the RAM chip 134, can write data thereto, or combinations thereof.

As can be seen from the exemplary system 100 of FIG. 1, however, due to conformance with standards, and the desirability of universal interoperability and compatibility, direct communicational pathways from the RCD 120 back to the processes 150 executing on the computing device, such as through the system bus, do not exist. Accordingly, while the RCD 120 can be modified or upgraded to generate, store, and act upon, its own internal digital data, there does not exist a communicational pathway by which such data can be directly communicated back to the processes 150 executing in the computing device.

Figure 2:
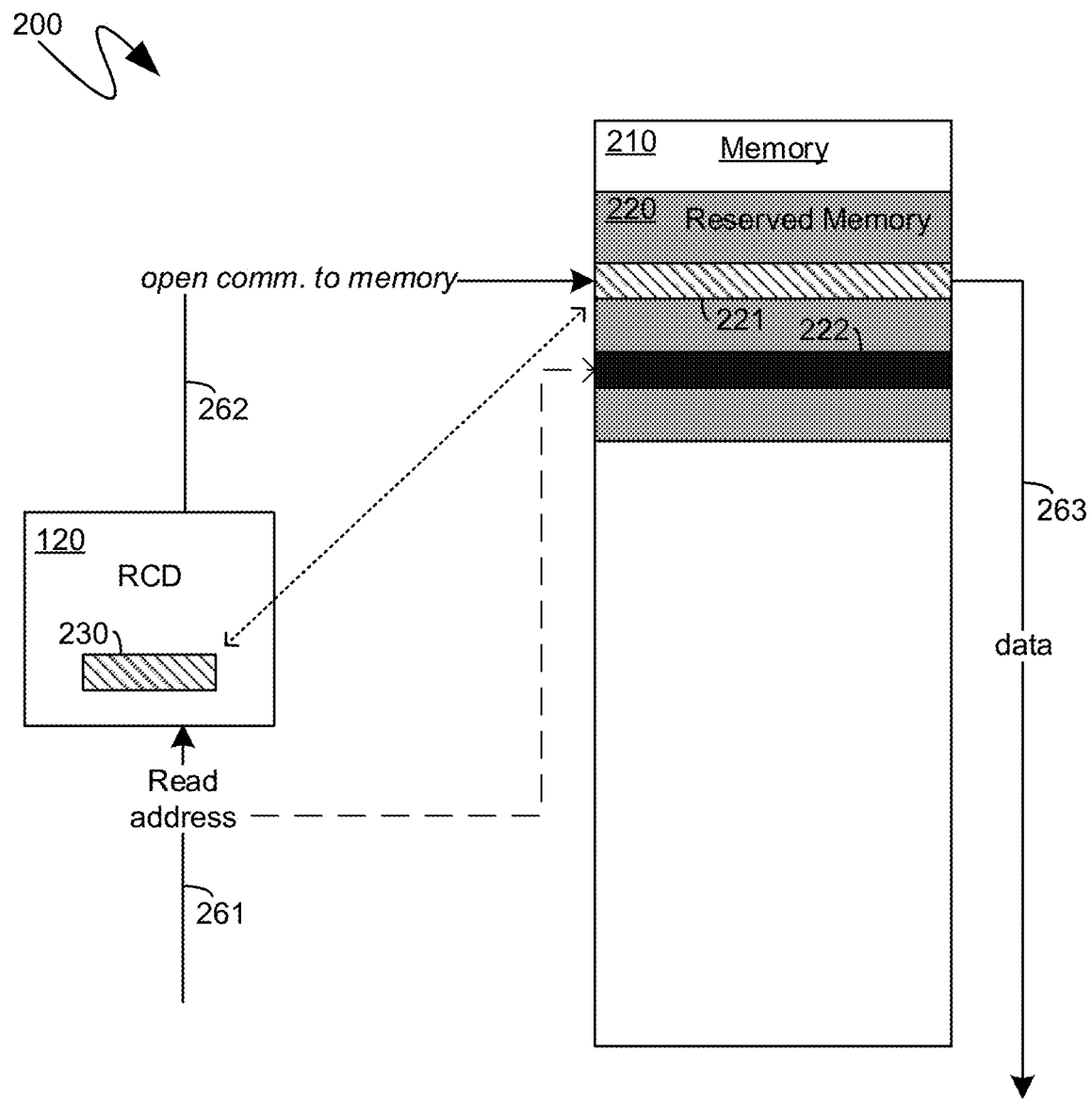
FIG. 2 is a system diagram of an exemplary system by which memory controller logic can indirectly return data to processes executing on a host computing device.

Turning to FIG. 2, the system 200 shown therein illustrates an exemplary mechanism by which data internal to the RCD 120, such as the exemplary data 230, can be communicated by the RCD 120 back to processes executing on the host computing device even though no direct communication mechanism exists. More specifically, the memory chips of a memory module can support an addressable memory space, such as exemplary addressable memory space 210, which can be addressed and, thereby, communicated with by processes executing on the computing device and, more specifically, on one or more of the processing units of the computing device, such as in the manner detailed above. According to one aspect, a portion of the memory space can be reserved and otherwise not utilized for the storage of computer-readable data by the processes executing on the computing device. Instead, such a reserved portion of the memory space can be utilized to provide mechanisms by which the RCD can indirectly return data to the processes executing on the computing device. For example, as illustrated in the exemplary system 200 of FIG. 2, the exemplary memory space 210 can comprise an exemplary reserved memory space 220. Such an exemplary reserved memory space 220 can comprise a sequence of individual memory addresses at which different data can be stored. According to one aspect, the reserved memory space 220 can be contiguous such that all of the individual memory addresses between the highest and lowest addresses of the reserved memory space can be part of the reserved memory space. According to another aspect, the reserved memory space 220 can be discontiguous such that gaps can exist between different portions of the reserved memory space 220. In either instance, so long as the RCD 120 is aware of the addresses belonging to the reserved memory 220, the precise addresses themselves, or their relationships to one another, can be irrelevant. To reserve a portion of the memory space, such as the exemplary reserved memory space 220, for utilization as will be described herewith, the operating system memory management can reserve such a memory space as uncached, write-through so that all reads and writes proceed directly to such memory, and, thus, to the RCD 120, without passing through the cache, which could intervene in unpredictable ways. Alternatively, or in addition, the reserved memory space 220 can be set aside for a specific process executing on the computing device in such a way that no other process utilizes that reserved memory space 220.

When the RCD 120 receives communications, from processes executing on the computing device, either seeking to write data to one or more particular memory addresses, to read data from one or more particular memory addresses, or combinations thereof, the RCD 120 can open a communicational connection between the identified memory circuitry and the system bus, such as in the manner detailed previously. In doing so, the RCD 120 can reference an internal table or other like correlation between the addresses specified by the communications, received from the processes executing on the computing device, via the system bus, and the locations of the individual computer-readable memory circuitry, such as can be found on memory chips, such as the aforementioned RAM chips.

For purposes of the mechanisms described herein, and illustrated by the exemplary system 200 of FIG. 2, the RCD 120 can detect communications seeking to read data from memory addresses that are part of the reserved memory 120 and can respond in accordance with the mechanisms described herein. More specifically, a communication seeking to read the data from a specific one of the memory addresses of the reserved memory 220, or a communication seeking to read data from any one of the memory addresses of the reserved memory 220, can be perceived as a request to obtain the data 230 that is internally maintained by the RCD 120. Accordingly, the RCD 120 can initially identify, from among data that was stored within the memory addresses that are part of the reserved memory 220, an address of the memory location that stores data that is equivalent to the data 230 being internally maintained by the RCD 120. The RCD 120 can then open communication to that memory location, thereby enabling that data to be read out of that memory location by the processes executing in the computing device and, thereby, enabling the RCD 120 to indirectly communicate the data 230 that is internally maintained by the RCD 120.

For example, the RCD 120 can receive the communication 261 which can be a request to read the data from the memory address 222 within the reserved memory 220. The RCP 120 can determine that the requested address 222 is within the reserved memory 220, or is otherwise a memory address that was preselected such that requests to read data from the memory address 222 can be interpreted by the RCD 120 as a request to read the data 230. The RCD 120 can then identify a different memory address at which is stored data that is equivalent to the internal data 230 maintained by the RCD 120. For example, the RCD 120 can identify the memory address 221, within the reserved memory 220, as having stored at that memory address 221 data that is equivalent to the data 230 that the RCD 120 is maintaining internally. The RCD 120 can then open a communicational path, as illustrated by the action 262, to the memory address 221 that was identified by the RCD 120 as having data that is equivalent to the data 230 that is maintained by the RCD 120. Thus, while the communication 261 can have requested the data at the memory address 222, the data 263 that can be obtained by the process is executing on the computing device that initiated the communication 261, can be the data, not from the memory address 222, but rather the data from the memory address 221, which is equivalent to the data 230 being maintained internally by the RCD 120. In such a manner, the RCD 120 can indirectly communicate, to processes executing on the host computing device, the data 230 that the RCD 120 is maintaining internally, by directly communicating, to those processes, equivalent data even though such equivalent data can be at a memory location 221 that differs from the memory location 222 that was requested by the communication 261.

The data that is stored within the reserved memory space 220 can be stored there in advance for utilization by the RCD 120 to indirectly return data, such as in the manner described. The storage of such data within the reserve memory space 220 can be performed by the operating system, after the reserved memory space 220 is reserved, or it can be performed by other processes executing on the computing device.

Because the RCD 120 can open a communicational pathway to a different set of memory circuitry than was originally identified by the address provided with the communication 261, a possibility of latency issues can be introduced if the memory address 221, selected by the RCD 120, corresponds to memory circuitry for which more clock cycles may be required to open a communicational channel than to the memory address 222 specified by the communication 261. For example, if the memory address 221 identifies memory circuitry within a same row buffer as the memory circuitry identified by the memory address 222, the opening of the communicational channel to the memory circuitry identified by the memory address 221 can occur within the same time as would be expected for the opening of the communication channel to the memory circuitry identified by the requested memory address 222. Conversely, if the memory circuitry identified by the memory address 221 is not even within a range of circuitry for which the memory chip is already primed for, then the opening of the communication channel to the memory circuitry identified by the memory address 221 can require additional clock cycles versus what would have been set aside for the opening of the communication channel to the memory circuitry identified by the requested memory address 222. Accordingly, according to one aspect, the range of reserved memory 220 can be minimized such that such timing concerns are irrelevant. Alternatively, according to another aspect, the timing can be modified so that a maximum latency is accounted for in each instance of a read directed to the reserved memory 220, such as that requested by the communication 261.

By providing mechanisms by which data that is internally maintained by an RCD can be indirectly communicated to processes executing on the computing device, the functionality of the RCD can be extended to collect, maintain, and ultimately communicate, certain types of data. In accordance with the RCD's role as a hardware memory controller operating directly on the same memory module as various memory chips, and other like computer readable memory circuitry, the RCD can be modified to collect, maintain, and ultimately communicate, data descriptive of, or otherwise related to, the memory of the same memory module on which the RCD is located. For example, the RCD can be modified to keep track of a quantity of memory reads, memory writes, or combinations thereof to specific, individual memory addresses, to contiguous or discontiguous memory address ranges, to discrete memory chips, or to other like memory groupings.

Figure 3A:
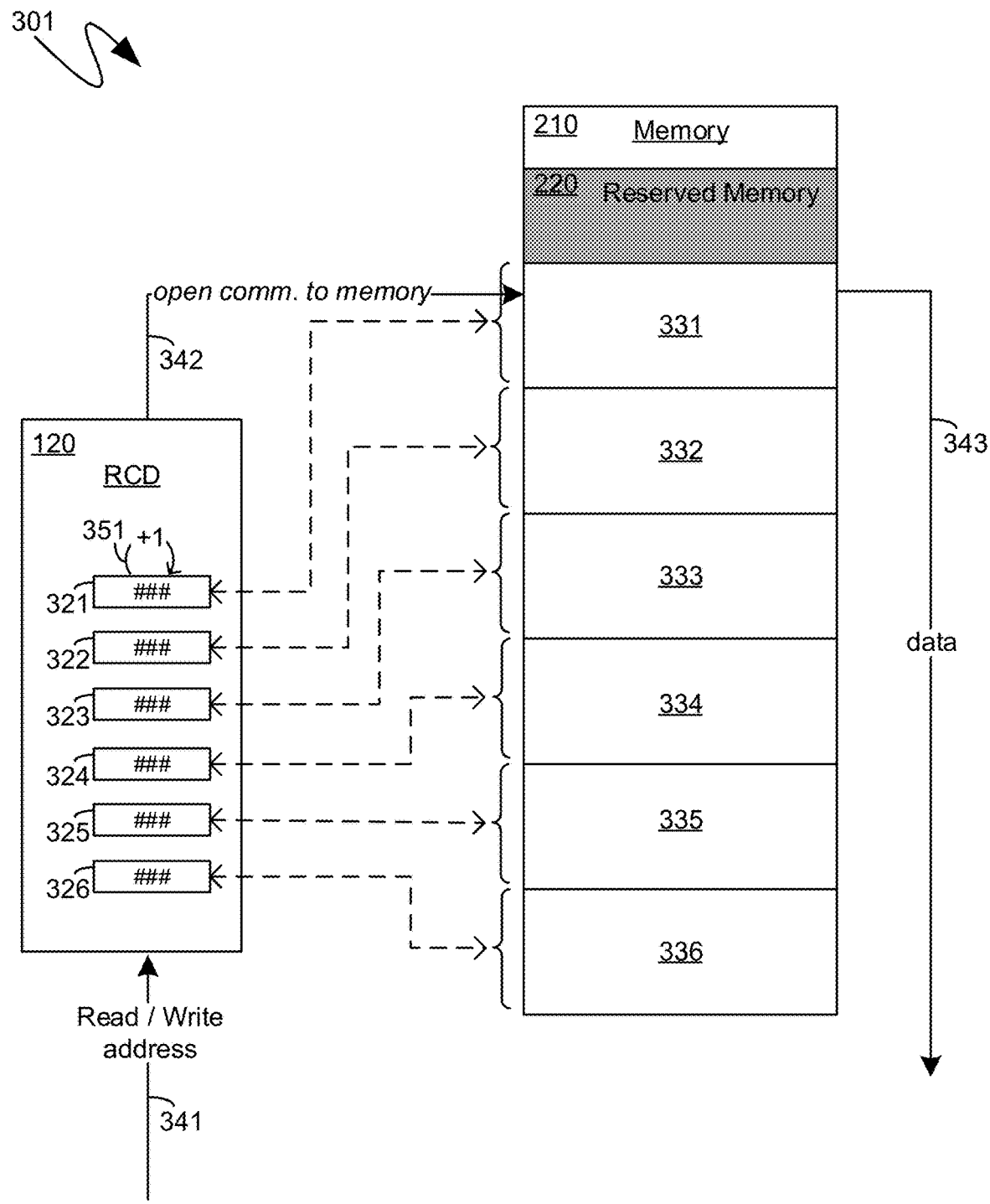
FIGS. 3a and 3b are a system diagram of an exemplary system by which memory controller logic can implement counters and indirectly return counter values to processes executing on a host computing device.

Turning to FIG. 3a, the system 301 shown therein illustrates an exemplary RCD 120 comprising multiple counters in the form of the counters 321, 322, 323, 324, 325 and 326. For purposes of illustration, the counters 321, 322, 323, 324, 325 and 326 are shown as counting the reads, writes, or combinations thereof directed to individual portions 331, 332, 333, 334, 335 and 336 of the memory space 210 described previously. Thus, for example, if a communication, such as exemplary communication 341, seeks to access memory within the portion 331, the RCD 120 can open a communication to the relevant memory circuitry, as illustrated by the action 342, which can enable the processes generating the communication 341 to obtain the data from that memory circuitry, as illustrated by the communication 343, or to write data thereto. In addition, the exemplary RCD 120 can further increment a counter corresponding to the portion 331, such as the exemplary counter 321, as illustrated by the exemplary increment action 351. The counters implemented by the RCD 120, such as the exemplary counters 321, 322, 323, 324, 325 and 326, can count only memory reads, with a separate set of counters counting memory writes, or the same counters can be utilized to count both reads and writes, as well as other permutations and combinations thereof, such as counting only those reads and/or writes that conform to preselected criteria or occur during preselected or specified time periods.

Figure 3B:
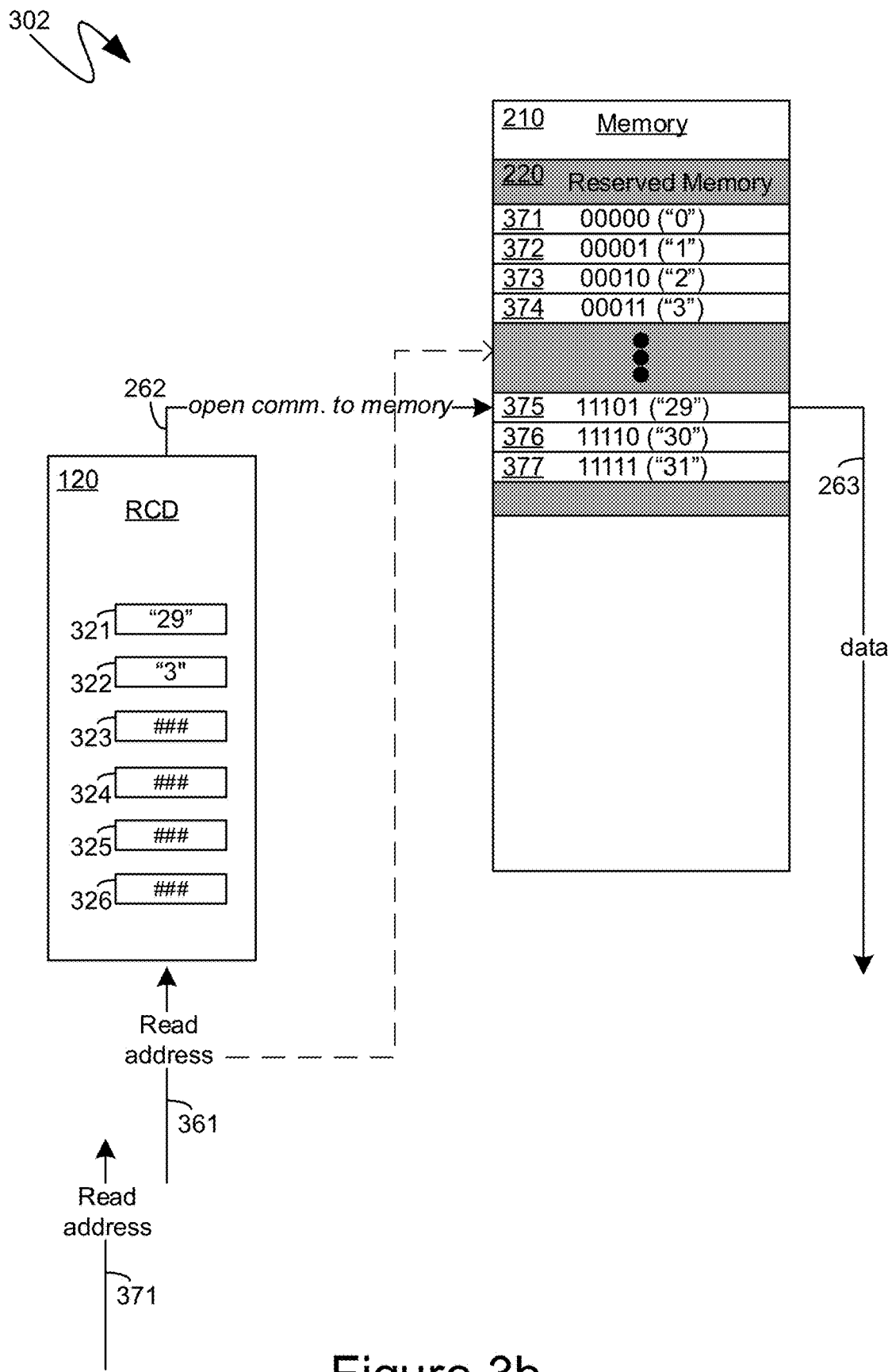

At a subsequent time, the values of the counters can be provided to processes executing on the computing device utilizing the indirect data transfer method described above. More specifically, and as shown in the exemplary system 302 of FIG. 3b, the reserved memory 220 can comprise different memory locations at which are stored different data representative of different numeric values, thereby enabling the RCD 120 to select from among those numeric values to indirectly communicate, to processes executing on the computing device, the numeric values of the counters 321, 322, 323, 324, 325 and 326. For example, the reserved memory 220 can comprise a contiguous sequence of numeric values such that there are no missing numeric values within the contiguous sequence, or, stated differently, that, as between two adjacent values in the numeric sequence, there is no intermediate value between them capable of being expressed by the numeric format being utilized. Thus, the exemplary system 302 illustrates the storage of five-bit digital values within the memory at the reserved memory addresses 371, 372, 373, 374, 375, 376 and 377. The utilization of five bits of digital data enables the digital representation of numeric integer values in a contiguous sequence from zero ("0") through ("31"). Other quantities of bits of digital data can be utilized to express numeric values, including integer values and floating-point numeric values, depending on the nature of the data being maintained internally by the RCD 120. Indeed, as indicated previously, the data in the reserved memory 220 need not be a numeric value at all. However, for purposes of the example illustrated in FIGS. 3a and 3b, wherein the RCD 120 comprises internal data in the form of internal counters, the reserved memory 220 is illustrated as being pre-populated with data representative of numeric values.

The quantity of the reserved memory 220 can be any quantity sufficient to store the pre-populated data that will then be subsequently utilized by the RCD 120 to indirectly communicate its own internal data by reference to the pre-populated data in the manner detailed above. According to one aspect, the quantity of the reserved memory 220 can be based on memory page sizes. For example, a common size of a memory page, such as is delineated by an operating system memory controller component, can be 2 MB. Accordingly, the quantity of the reserved memory 220 can be a multiple of 2 MB. For example, the reserved memory 220, illustrated in the exemplary system 302 of FIG. 3b, can be 2 MB in size, providing for the storage of 65,536 different 32-byte data sets, such as numeric values expressed by 32-bytes. Various memory communication standards can specify minimum data transfer quantities, and 32-bytes can be a common amount of data that can serve as an atomic data transfer amount, such that data is transferred in 32-bytes groupings or chunks, even if fewer data was requested. Even if only the first 2-bytes of each individual 32-byte data set were utilized to express a numeric value, if the reserved memory 220 was 2 MB in size, it could accommodate the expression of a contiguous set of integers from "0" to "65,535" (2-bytes is the equivalent of 16-bits of data and the value "two" raised to the sixteenth power is 65,536).

In instances where the quantity of different data, such as the quantity of different numerical values, capable of being stored within the reserved memory 220 is limited, compression mechanisms can be utilized to enable the RCD 120 to indirectly return the internal data that it maintains. For example, each of the 32 unique values capable of being represented by the 5-bit digital representations showing exemplary system 302 of FIG. 3b, can, instead of representing the exact value, represent a range of values. Thus, for example, while the value of "0" can be utilized to represent a counted quantity of zero, the value of "1", such as is stored in memory location 372, can be utilized to represent a counted quantity of somewhere between one and ten, the value of "2", such as is stored in memory location 373, can be utilized to represent a counted quantity of somewhere between eleven and twenty, and so on.

According to one aspect, the counted values from each of the counters of the RCD 120, such as the exemplary counters 321, 322, 323, 324, 325 and 326, can be sequentially provided by the RCD 120 in response to multiple requests sequentially directed to memory addresses that will be interpreted by the RCD 120 as requests for the counter values, such as, for example, memory addresses within the reserved memory 220. For example, a first read request 361, directed to a memory address within the reserved memory 220, can be received. In response, the RCD 120 can determine that the numeric value of the counter 321, such as the numeric value "29" is to be returned. The RCD 120 can determine that the numeric value of the counter 321 is to be returned based either on the read request 361 being directed to any memory within the reserved memory 220, or based on the read request 361 being directed to a specific memory address that can be uniquely associated with the counter 321 such that a read request specifying that memory address always results in the RCD 120 providing the counted value of the exemplary counter 321. Upon determining that the numeric value of the counter 321, namely the numeric value "29", is to be returned, the RCD 120 can identify a memory within the reserved memory 220 at which the value "29" is already stored, such as, for example, memory identified by the memory address 375. The RCD 120 can then, in response to the read request 361, open a communicational channel to the memory 375, as illustrated by the action 262, thereby enabling the numeric value "29" to be read out by processes executing on the computing device, as illustrated by the action 263. Subsequently, another read request 371 can be received.

The receipt of such a subsequent request 371, which is also directed to the reserved memory 220, can be treated by the RCD 120 as a read request for the next subsequent counter, such as exemplary counter 322. According to one aspect, the RCD 120 can treat the read request 371 as a request for the counter value of the exemplary counter 322 simply by virtue of the fact that the read request 371 is received after the read request 361 and both the read request 361 and the read request 371 referenced memory addresses within the reserved memory 220. According to an alternative aspect, the RCD 120 can treat the read request 371 as a request for the counter value of the exemplary counter 322 because the read request 371 identified a specific memory address, within the reserved memory 220, such that any read request directed to that specific memory address will result in the RCD 120 indirectly returning the counted value of the exemplary counter 322. In such a manner the counted values of multiple counters maintained internally by the RCD 120 can be indirectly communicated to processes executing on the computing device.

In addition to read requests, which can trigger the indirect return of data maintained internally by the RCD 120, as detailed above, write requests to specific addresses can be utilized to communicate commands to the RCD 120. Such commands can instruct the RCD 120 to perform actions with respect to the data maintained internally by the RCD 120. For example, a write command to a specific memory address, such as a memory address within the reserved memory 220, can be interpreted by the RCD 120 as a command to reset the counter values. A write command to a different memory address, for example, can be interpreted by the RCD 120 as a command to start counting. Other commands can be associated with other specific memory addresses. Such commands can include commands for the RCD to enter into a mode within which it can operate in the manner described above, a command for the RCD to exit such a mode, a command for the RCD to return specific values with subsequent read commands, and other like commands. Because write commands can modify the data stored at the memory locations whose addresses are identified by the write command, the write commands can write back to those memory locations the same data that was they are previously, thereby leaving the memory locations unaffected while continuing to issue commands to the RCD 120 in the indirect manner described.

According to one aspect, the above described operations of the RCD 120 can be negotiated by the BIOS of the computing device during startup, such as utilizing an I2C interface. Alternatively, or in addition, sequences of read commands, write commands, or combinations thereof can be preselected such that if those sequences are detected by the RCD 120, the RCD 120 can enter into a mode of operation in the manner detailed above, or exit such a mode of operation.

Figure 4:
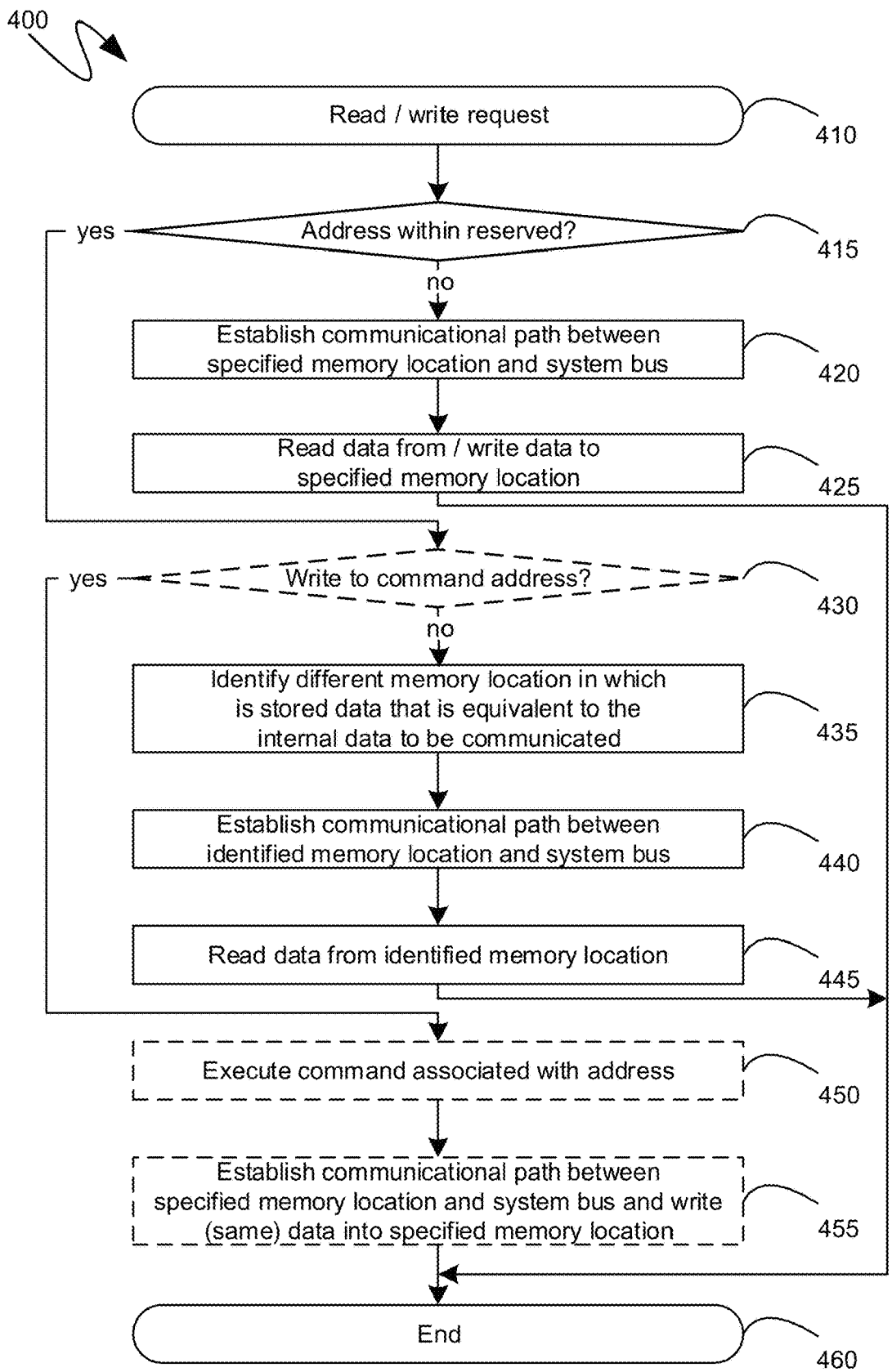
FIG. 4 is a flow diagram of an exemplary series of steps by which memory controller logic can indirectly return data to processes executing on a host computing device.

Turning to FIG. 4, the exemplary flow diagram 400 shown therein illustrates an exemplary series of steps by which a memory controller logic can indirectly return data to processes executing on a computing device. Initially, at step 410, a read or write request can be received. At step 415, a determination can be made as to whether the read or write request is directed to a memory address that can necessitate special processing, such as that detailed previously. If, at step 450, it is determined that the memory request received at step 410 is not directed to a memory address that has been previously identified as signifying additional processing, then a communicational path can be established between the memory location specified by the memory request received at step 410, as illustrated by step 420, and, at step 425, data can either be read from or written to the memory circuitry identified by that memory location. The relevant processing can then end at step 460.

Conversely, if, at step 415, it is determined that the address specified by the memory request, received at step 410, is within a reserved memory space, or is otherwise a previously agreed-upon memory address associated with additional processing, then performance of the exemplary flow diagram 400 can proceed to an optional step 430, at which point a further determination can be made as to whether the command is a write command to a specific address which, as detailed previously, can be utilized to instruct the RCD to perform specific commands, such as commands acting upon data that is internally maintained by the RCD. If, at optional step 430, it is determined that the received memory request is a write command to a previously agreed-upon memory address, then processing can proceed with optional step 450, at which point the RCD can execute the command associated with the address, as well as optional step 455, at which point to the RCD can establish a communicational path between the specified memory location and the system bus to allow data to be written into the specified memory location. As indicated previously, in the performance of optional step 455, the same data can be written back into the specified memory location to avoid inadvertently changing data stored in that memory location, since the primary purpose of the memory request was to issue the command to the RCD, not necessarily to change the data stored at that memory location. Subsequently, the relevant processing can end at step 460.

Returning back to optional step 430, if, at step 430, it is determined that the memory request at step 410 is not a write command, but rather a read command seeking to read data from a memory address within a reserved space, or, if optional step 430 is simply not performed, processing can proceed with step 435, at which point a different memory location can be identified, which differs from the memory location specified by the memory request received at step 410. More specifically, and as detailed above, the memory location identified at step 435 can be the memory location at which is stored data that is equivalent to the internal data of the RCD that the RCD seeks to indirectly communicate.

Subsequently, at step 440, a communicational path can be established between the memory circuitry identified by the memory location of step 435, and processes executing on the computing device. As indicated previously, the memory location identified at step 435 can differ from that requested by the memory request received at step 410. Thus, the communicational path established at step 440 can differ from the one that was explicitly requested. Nevertheless, at step 445, the data can be read from the memory circuitry with which the communication path was established at step 440. Because such memory circuitry can have stored on it data that is equivalent to the internal data of the RCD, the reading of such data, at step 445, allows the RCD to indirectly communicate the internal data to the processes executing on the computing device. Subsequently, the relevant processing can end at step 460.

Figure 5:
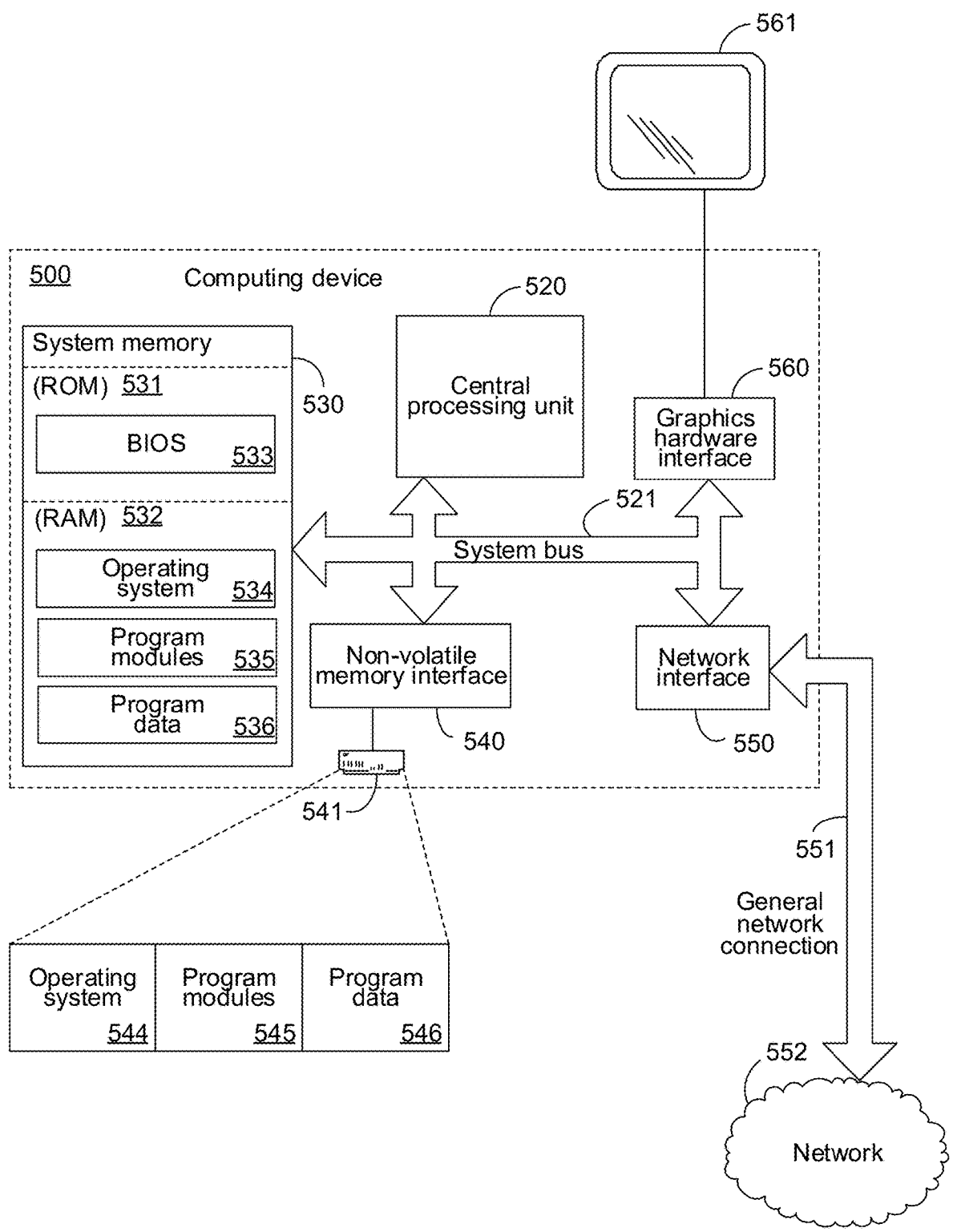
FIG. 5 is a block diagram of an exemplary computing device.

Turning to FIG. 5, an exemplary computing device 500 is illustrated which can perform some or all of the mechanisms and actions described above. The exemplary computing device 500 can include, but is not limited to, one or more central processing units (CPUs) 520, a system memory 530, and a system bus 521 that couples various system components including the system memory to the processing unit 520. The system bus 521 may be any of several types of bus structures including a memory bus or memory controller, a peripheral bus, and a local bus using any of a variety of bus architectures. The computing device 500 can optionally include graphics hardware, including, but not limited to, a graphics hardware interface 560 and a display device 561, which can include display devices capable of receiving touch-based user input, such as a touch-sensitive, or multi-touch capable, display device. Depending on the specific physical implementation, one or more of the CPUs 520, the system memory 530 and other components of the computing device 500 can be physically co-located, such as on a single chip. In such a case, some or all of the system bus 521 can be nothing more than silicon pathways within a single chip structure and its illustration in FIG. 5 can be nothing more than notational convenience for the purpose of illustration.

The computing device 500 also typically includes computer readable media, which can include any available media that can be accessed by computing device 500 and includes both volatile and nonvolatile media and removable and non-removable media. By way of example, and not limitation, computer readable media may comprise computer storage media and communication media. Computer storage media includes media implemented in any method or technology for storage of content such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired content and which can be accessed by the computing device 500. Computer storage media, however, does not include communication media. Communication media typically embodies computer readable instructions, data structures, program modules or other data in a modulated data signal such as a carrier wave or other transport mechanism and includes any content delivery media. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 530 includes computer storage media in the form of volatile and/or nonvolatile memory such as read only memory (ROM) 531 and random access memory (RAM) 532. A basic input/output system 533 (BIOS), containing the basic routines that help to transfer content between elements within computing device 500, such as during start-up, is typically stored in ROM 531. RAM 532 typically contains data and/or program modules that are immediately accessible to and/or presently being operated on by processing unit 520. By way of example, and not limitation, FIG. 5 illustrates operating system 534, other program modules 535, and program data 536.

The computing device 500 may also include other removable/non-removable, volatile/nonvolatile computer storage media. By way of example only, FIG. 5 illustrates a hard disk drive 541 that reads from or writes to non-removable, nonvolatile magnetic media. Other removable/non-removable, volatile/nonvolatile computer storage media that can be used with the exemplary computing device include, but are not limited to, magnetic tape cassettes, flash memory cards, digital versatile disks, digital video tape, solid state RAM, solid state ROM, and other computer storage media as defined and delineated above. The hard disk drive 541 is typically connected to the system bus 521 through a non-volatile memory interface such as interface 540.

The drives and their associated computer storage media discussed above and illustrated in FIG. 5, provide storage of computer readable instructions, data structures, program modules and other data for the computing device 500. In FIG. 5, for example, hard disk drive 541 is illustrated as storing operating system 544, other program modules 545, and program data 546. Note that these components can either be the same as or different from operating system 534, other program modules 535 and program data 536. Operating system 544, other program modules 545 and program data 546 are given different numbers hereto illustrate that, at a minimum, they are different copies.

The computing device 500 may operate in a networked environment using logical connections to one or more remote computers. The computing device 500 is illustrated as being connected to the general network connection 551 (to a network 552) through a network interface or adapter 550, which is, in turn, connected to the system bus 521. In a networked environment, program modules depicted relative to the computing device 500, or portions or peripherals thereof, may be stored in the memory of one or more other computing devices that are communicatively coupled to the computing device 500 through the general network connection 561. It will be appreciated that the network connections shown are exemplary and other means of establishing a communications link between computing devices may be used.

Although described as a single physical device, the exemplary computing device 500 can be a virtual computing device, in which case the functionality of the above-described physical components, such as the CPU 520, the system memory 530, the network interface 560, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where the exemplary computing device 500 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. The term "computing device", therefore, as utilized herein, means either a physical computing device or a virtualized computing environment, including a virtual computing device, within which computer-executable instructions can be executed in a manner consistent with their execution by a physical computing device. Similarly, terms referring to physical components of the computing device, as utilized herein, mean either those physical components or virtualizations thereof performing the same or equivalent functions.

The descriptions above include, as a first example a method for enabling memory controller logic to externally communicate internal data, the method comprising: receiving a request to read data stored at a first memory location; establishing a communicational path to the first memory location, thereby enabling a reading of the data stored at the first memory location, if the first memory location is not within a first subset of memory locations; identifying, if the first memory location is within the first subset of memory locations, a second memory location, differing from the first memory location, at which is stored data that is equivalent to the internal data that is to be externally communicated; and responding to the request to read the first memory location by establishing a communicational path to the second memory location, thereby enabling a reading of the data stored at the second memory location if the first memory location is within the first subset of memory locations.

A second example is the method of the first example, wherein the second memory location is also within the first subset of memory locations.

A third example is the method of the second example, wherein the first subset of memory locations store all data that the memory controller logic is capable of externally communicating.

A fourth example is the method of the first example, wherein the first subset of memory locations individually store data representing discrete numeric values.

A fifth example is the method of the fourth example, wherein the numeric values represented by the data stored at the first subset of memory locations are contiguous integer values within a predefined numeric range.

A sixth example is the method of the first example, wherein the internal data represents a numeric value of a first counter.

A seventh example is the method of the sixth example, further comprising: incrementing the first counter to count at least one of: a request to read data stored at a third memory location or a request to write data stored at a third memory location, the third memory location being not within the first subset of memory.

An eighth example is the method of the seventh example, wherein the memory controller logic controls access to a set of memory that is subdivided into multiple subsets, each subset of the multiple subsets being associated with a counter from among a set of counters, wherein the first counter is associated with a subset that includes the third memory location.

A ninth example is the method of the first example, wherein the internal data comprises a first internal data and a separately maintained second internal data, the first internal data being the internal data that was externally communicated by responding to the request to read the first memory location by establishing the communicational path to the second memory location if the first memory location was within the first subset, the method further comprising: receiving a request to read data stored at a third memory location; establishing a communicational path to the third memory location, thereby enabling a reading of the data stored at the third memory location, if the third memory location is not within the first subset of memory locations; if both: (1) the first memory location was not within the first subset of memory locations and (2) the third location is within the first subset of memory locations, then performing steps comprising: identifying the second memory location at which is stored the data that is equivalent to the first internal data; and responding to the request to read the third memory location by establishing a communicational path to the second memory location; if both: (1) the first memory location was within the first subset of memory locations and (2) the third location is also within the first subset of memory locations, then performing steps comprising: identifying a fourth memory location, differing from the third memory location, at which is stored data that is equivalent to the second internal data; and responding to the request to read the third memory location by establishing a communicational path to the fourth memory location.

A tenth example is the method of the first example, further comprising: receiving a request to write data to a second memory location; establishing a communicational path to the second memory location, thereby enabling a writing of data to the second memory location, if the second memory location is not one of a set of command-triggering memory locations; and performing a command with respect to the internal data if the second memory location is one of the set of command-triggering memory locations.

An eleventh example is the method of the tenth example, wherein each command-triggering memory location, of the set of command-triggering memory locations, is individually associated with a unique command such that a request to write data to a specific one of the set of command-triggering memory locations, triggers performance of a corresponding unique command associated with the specific one of the set of command-triggering memory locations.

A twelfth example is the method of the tenth example, wherein the command is one of: zero out counters, start counting or report counter values.

A thirteenth example is the method of the tenth example, wherein the set of command-triggering memory locations are within the first subset of memory locations.

A fourteenth example is the method of the first example, further comprising: reserving the first subset of memory locations prior to the receiving the request to read the data stored at the first memory location based on detecting a pre-defined sequence of both: (1) reads of data stored at memory locations within the first subset of memory locations and (2) writes of data to memory locations within the first subset of memory locations.

A fifteenth example is a register clock driver (RCD) chip comprising: internal memory storing a first data; and a processing unit which, when executing, performs steps comprising: receive a request to read data stored at a first memory location, the first memory location being on a memory chip external to the RCD, the RCD controlling read and write access to the memory chip; establish a communicational path to the first memory location, thereby enabling a reading of the data stored at the first memory location, if the first memory location is not within a first subset of memory locations; identify, if the first memory location is within the first subset of memory locations, a second memory location, differing from the first memory location, at which is stored data that is equivalent to the first data; and respond to the request to read the first memory location by establishing a communicational path to the second memory location, thereby enabling a reading of the data stored at the second memory location if the first memory location is within the first subset of memory locations.

A sixteenth example is the RCD chip of the fifteenth example, wherein the internal memory is utilized by the RCD chip as a counter to count at least one of: a quantity of reads to a counted subset of memory locations or a quantity of writes to the counted subset of memory locations; and wherein further the first data is a first numeric value of the counter.

A seventeenth example is the RCD chip of the fifteenth example, wherein the processing unit, when executing, performs further steps comprising: receive a request to write data to a second memory location; establish a communicational path to the second memory location, thereby enabling a writing of data to the second memory location, if the second memory location is not one of a set of command-triggering memory locations; and perform a command with respect to the first data if the second memory location is one of the set of command-triggering memory locations.

An eighteenth example is a computing device comprising: one or more central processing units (CPUs); random access memory (RAM); a register clock driver (RCD) chip controlling read and write access to the RAM and comprising internal memory storing a first data; and one or more computer-readable media comprising computer-executable instructions, which, when executed by the one or more CPUs, cause the one or more CPUs to issue a request to read data stored at a first memory location; wherein, if the first memory location is not within a first subset of memory locations, the RCD chip establishes a communicational path between the one or more CPUs and a portion of the RAM corresponding to the first memory location, thereby enabling the one or more CPUs to read the data stored at the first memory location; and wherein further, if the first memory location is within the first subset of memory locations, the RCD chip identifies, a second memory location, differing from the first memory location, at which is stored data that is equivalent to the first data and responds to the request to read the first memory location by establishing a communicational path to the second memory location.

A nineteenth example is a computing device of the eighteenth example, wherein the internal memory of the RCD chip stores multiple discrete counter values; and wherein further the one or more computer-readable media comprise additional computer-executable instructions, which, when executed by the one or more CPUs, cause the one or more CPUs to issue multiple requests, in a sequential manner, to read data stored at memory locations within the first subset of memory, the multiple requests resulting in the RCD establishing communicational paths to other memory locations storing values equivalent to the multiple discrete counter values, thereby providing the multiple discrete counter values to the additional computer-executable instructions.

A twentieth example is method of the eighteenth example, wherein the one or more computer-readable media comprise additional computer-executable instructions, which, when executed by the one or more CPUs, cause the one or more CPUs to issue a request to write data to a second memory location that is one of a set of command-triggering memory locations, the request causing the RCD chip to perform a command with respect to the first data.

As can be seen from the above descriptions, mechanisms by which memory controller logic can indirectly return data to processes executing on a host computing device have been presented. In view of the many possible variations of the subject matter described herein, we claim as our invention all such embodiments as may come within the scope of the following claims and equivalents thereto.

I claim:

1. A method for enabling memory controller logic to externally communicate internal data, the method comprising:
   receiving a request to read data stored at a first memory location;
   establishing a communicational path to the first memory location, thereby enabling a reading of a first data stored at the first memory location, if the first memory location is not within a first subset of memory locations;
   identifying, if the first memory location is within the first subset of memory locations, a second memory location, differing from the first memory location, at which is stored a second data that is equivalent to the internal data that is to be externally communicated, the identifying being based on the second data, already stored at the second memory location, being equivalent to the internal data that is to be externally communicated; and
   responding to the request to read the first memory location by establishing a communicational path to the second memory location, thereby enabling a reading of the second data stored at the second memory location if the first memory location is within the first subset of memory locations.

2. The method of claim 1, wherein the second memory location is also within the first subset of memory locations.

3. The method of claim 1, wherein the first subset of memory locations individually store data representing unique numeric values within a predefined numeric range.

4. The method of claim 1, wherein the internal data represents a numeric value of a first counter of the memory controller logic.

5. The method of claim 4, further comprising:
   incrementing, by the memory controller logic, the first counter to count at least one of: a request to read data stored at a third memory location or a request to write data stored at a third memory location, the third memory location being not within the first subset of memory.

6. The method of claim 5, wherein the memory controller logic controls access to a set of memory that is subdivided into multiple subsets, each subset of the multiple subsets being associated with a counter from among a set of counters, wherein the first counter is associated with a subset that includes the third memory location.

7. The method of claim 1, wherein the internal data comprises a first internal data and a separately maintained second internal data, the first internal data being the internal data that was externally communicated by responding to the request to read the first memory location by establishing the communicational path to the second memory location if the first memory location was within the first subset, the method further comprising:

receiving a request to read data stored at a third memory location;
establishing a communicational path to the third memory location, thereby enabling a reading of the data stored at the third memory location, if the third memory location is not within the first subset of memory locations;
if both: (1) the first memory location was not within the first subset of memory locations and (2) the third location is within the first subset of memory locations, then performing steps comprising:
identifying the second memory location at which is stored the data that is equivalent to the first internal data; and
responding to the request to read the third memory location by establishing a communicational path to the second memory location;
if both: (1) the first memory location was within the first subset of memory locations and (2) the third location is also within the first subset of memory locations, then performing steps comprising:
identifying a fourth memory location, differing from the third memory location, at which is stored data that is equivalent to the second internal data; and
responding to the request to read the third memory location by establishing a communicational path to the fourth memory location.

8. The method of claim 1, further comprising:
receiving a request to write data to a second memory location;
establishing a communicational path to the second memory location, thereby enabling a writing of data to the second memory location, if the second memory location is not one of a set of command-triggering memory locations; and
performing a command with respect to the internal data if the second memory location is one of the set of command-triggering memory locations.

9. The method of claim 8, wherein each command-triggering memory location, of the set of command-triggering memory locations, is individually associated with a unique command such that a request to write data to a specific one of the set of command-triggering memory locations, triggers performance of a corresponding unique command associated with the specific one of the set of command-triggering memory locations.

10. The method of claim 8, wherein the command is one of: zero out counters, start counting or report counter values.

11. The method of claim 8, wherein the set of command-triggering memory locations are within the first subset of memory locations.

12. The method of claim 1, further comprising:
reserving the first subset of memory locations prior to the receiving the request to read the data stored at the first memory location based on detecting a pre-defined sequence of both: (1) reads of data stored at memory locations within the first subset of memory locations and (2) writes of data to memory locations within the first subset of memory locations.

13. The method of claim 1, wherein the internal data is stored in memory that is part of the memory controller logic itself.

14. The method of claim 1, wherein the internal data cannot be directly externally communicated by the memory controller logic.

15. A register clock driver (RCD) chip comprising:
internal memory storing a first data; and
a processing unit which, when executing, performs steps comprising:
receive a request to read data stored at a first memory location, the first memory location being on a memory chip external to the RCD, the RCD controlling read and write access to the memory chip;
establish a communicational path to the first memory location, thereby enabling a reading of a first data stored at the first memory location, if the first memory location is not within a first subset of memory locations;
identify, if the first memory location is within the first subset of memory locations, a second memory location, differing from the first memory location, at which is stored a second data that is equivalent to the first data stored in the internal memory of the RCD, the identifying being based on the second data, already stored at the second memory location, being equivalent to the first data stored in the internal memory of the RCD; and
respond to the request to read the first memory location by establishing a communicational path to the second memory location, thereby enabling a reading of the data stored at the second memory location if the first memory location is within the first subset of memory locations.

16. The RCD chip of claim 15, wherein the internal memory is utilized by the RCD chip as a counter to count at least one of: a quantity of reads to a counted subset of memory locations or a quantity of writes to the counted subset of memory locations; and wherein further the first data is a first numeric value of the counter.

17. The RCD chip of claim 15, wherein the processing unit, when executing, performs further steps comprising:
receive a request to write data to a second memory location;
establish a communicational path to the second memory location, thereby enabling a writing of data to the second memory location, if the second memory location is not one of a set of command-triggering memory locations; and
perform a command with respect to the first data if the second memory location is one of the set of command-triggering memory locations.

18. A computing device comprising:
one or more central processing units (CPUs);
random access memory (RAM);
a register clock driver (RCD) chip controlling read and write access to the RAM and comprising internal memory storing a first data; and
one or more computer-readable media comprising computer-executable instructions, which, when executed by the one or more CPUs, cause the one or more CPUs to issue a request to read data stored at a first memory location;
wherein, if the first memory location is not within a first subset of memory locations, the RCD chip establishes a communicational path between the one or more CPUs and a portion of the RAM corresponding to the first memory location, thereby enabling the one or more CPUs to read a first data stored at the first memory location; and
wherein further, if the first memory location is within the first subset of memory locations, the RCD chip identifies a second memory location, differing from the first memory location, at which is stored a second data that is equivalent to the first data stored in the internal memory of the RCD and responds to the request to read the first memory location by establishing a communicational path to the second memory location, the identifying being based on the second data, already stored at the second memory location, being equivalent to the first data stored in the internal memory of the RCD.

19. The computing device of claim 18, wherein the internal memory of the RCD chip stores multiple discrete counter values; and wherein further the one or more computer-readable media comprise additional computer-executable instructions, which, when executed by the one or more CPUs, cause the one or more CPUs to issue multiple requests, in a sequential manner, to read data stored at memory locations within the first subset of memory, the multiple requests resulting in the RCD establishing communicational paths to other memory locations storing values equivalent to the multiple discrete counter values, thereby providing the multiple discrete counter values to the additional computer-executable instructions.

20. The computing device of claim 18, wherein the one or more computer-readable media comprise additional computer-executable instructions, which, when executed by the one or more CPUs, cause the one or more CPUs to issue a request to write data to a second memory location that is one of a set of command-triggering memory locations, the request causing the RCD chip to perform a command with respect to the first data.

* * * * *